(12) United States Patent
Kaneda

(10) Patent No.: US 6,800,816 B2
(45) Date of Patent: Oct. 5, 2004

(54) WIRING CIRCUIT BOARD HAVING BUMPS AND METHOD OF PRODUCING SAME

(75) Inventor: Yutaka Kaneda, Kanuma (JP)

(73) Assignee: Sony Chemicals Corp, Tokyo (JP)

( * ) Notice: Subject to any disclaimer, the term of this patent is extended or adjusted under 35 U.S.C. 154(b) by 0 days.

(21) Appl. No.: 09/951,611

(22) Filed: Sep. 14, 2001

(65) Prior Publication Data

US 2002/0038721 A1 Apr. 4, 2002

(30) Foreign Application Priority Data

Oct. 3, 2000 (JP) .......................... 2000-303745

(51) Int. Cl.⁷ .......................... H05K 1/11; H01R 12/04
(52) U.S. Cl. .................. 174/267; 174/250; 174/254; 174/261; 361/774; 257/737
(58) Field of Search .................. 174/250, 255, 174/256, 257, 258, 259, 261, 267, 262, 260; 361/750, 772, 774, 795, 807, 808, 760; 257/737, 778, 786

(56) References Cited

U.S. PATENT DOCUMENTS

| | | | | |
|---|---|---|---|---|
| 3,217,089 A | * | 11/1965 | Beck .......................... | 174/261 |
| 5,081,520 A | * | 1/1992 | Yoshii et al. ............... | 257/702 |
| 5,523,174 A | * | 6/1996 | Tamaki ....................... | 427/436 |
| 5,629,835 A | * | 5/1997 | Mahulikar et al. .......... | 174/252 |
| 5,821,626 A | * | 10/1998 | Ouchi et al. ................ | 257/778 |
| 5,831,832 A | * | 11/1998 | Gillette et al. .............. | 257/737 |
| 5,877,559 A | * | 3/1999 | Takayama et al. .......... | 257/773 |
| 5,914,179 A | * | 6/1999 | Inaba .......................... | 428/209 |
| 5,958,209 A | * | 9/1999 | Sakai et al. ................. | 205/241 |
| 5,965,944 A | * | 10/1999 | Frankoski et al. .......... | 257/667 |
| 6,085,414 A | * | 7/2000 | Swarbrick et al. ........... | 205/78 |
| 6,157,084 A | * | 12/2000 | Hino et al. .................. | 257/773 |
| 6,204,558 B1 | * | 3/2001 | Yanagida ..................... | 257/737 |
| 6,242,103 B1 | * | 6/2001 | Farnworth et al. .......... | 428/458 |
| 6,252,176 B1 | * | 6/2001 | Kuramochi et al. ........ | 174/255 |
| 6,284,353 B1 | * | 9/2001 | Takada et al. .............. | 428/209 |
| 6,291,081 B1 | * | 9/2001 | Kurabe et al. .............. | 174/257 |
| 6,294,316 B1 | * | 9/2001 | Kaneda et al. ............. | 430/314 |
| 6,323,434 B1 | * | 11/2001 | Kurita et al. ............... | 174/255 |
| 6,589,870 B1 | * | 7/2003 | Katoh ......................... | 438/690 |

* cited by examiner

Primary Examiner—Kamand Cuneo
Assistant Examiner—J B Patel
(74) Attorney, Agent, or Firm—Oliff & Berridge, PLC

(57) ABSTRACT

A method of manufacturing a wiring circuit board having bumps is disclosed in which a stable bump connection is possible, and complex operations such as plating pretreatment are unnecessary. Bumps having a surface roughness on the tip face thereof of 0.2 to 20 μm are formed by forming an etching mask for bump formation on bump formation surface of a metal foil which has a thickness (t1+t2) which is the sum of a thickness t1 of a wiring circuit and a height t2 of bumps to be formed on wiring circuit and which has a surface roughness of the bump formation surface thereof of 0.2 to 20 μm, and half etching the metal foil from the side of the etching mask for bump formation to a depth corresponding to the desired bump height t2.

3 Claims, 4 Drawing Sheets

WIRING CIRCUIT BOARD HAVING BUMPS AND METHOD OF PRODUCING SAME

BACKGROUND OF THE INVENTION

1. Field of the Invention

The present invention relates to a wiring circuit board having bumps, where the bumps are of a uniform height, and a method of manufacturing the same.

2. Description of the Related Art

Microscopic bumps (for example, bumps being a diameter of 50 μm and a height of 30 μm) are widely used when connecting electronic components such as a semiconductor device and a liquid crystal display device to a wiring circuit board, or when connecting the layers of a multi-layer wiring board.

A typical method of forming bumps of this size is shown in FIGS. 5A to 5E.

Specifically, first, as shown in FIG. 5A, a 2 layer flexible board 53 is made up of a polyimide film 51 on a copper toil 52, and copper toil 52 is patterned by photolithography to form a wiring circuit 54 (FIG. 5B).

Next, a cover coat layer 55 is formed on wiring circuit 54 in accordance with conventional methods (FIG. 5C). For example, cover coat layer 55 can be formed by forming a polyamic acid layer on wiring circuit 54, patterning by photolithography, and imidization. Alternatively, a resist ink may also be printed thereon.

Next, the area on polyimide film 51 that corresponds to wiring circuit 54 is irradiated with laser light to form bump holes 56 (FIG. 5D). Then, after covering cover coat layer 55 with a protective film as needed (not shown in the Figures), microscopic bumps are formed by growing metal bumps 57 by means or electrolytic plating on the portions of wiring circuit 54 that are exposed in the bottom of bump holes 56 (FIG. 5E).

However, when opening bump holes 56 by means of laser irradiation, there is a problem with variations in open space due to variations in the amount of smear adhered to the bottom of bump holes 56, and as a result, there is a problem with large variations developing in the height of metal bumps 57. Because of this, stable bump connections are difficult. In particular, connecting semiconductor devices to the wiring circuit in one batch by means of ultrasound is difficult. In addition, a plating pre-treatment Is essential in order to improve the strength of the adherence between wiring circuit 54 and the metal bumps 57 formed thereon.

SUMMARY OF THE INVENTION

An object of the present invention is to solve the aforementioned problems in the prior art, make stable bump connections possible, and to provide a method of manufacturing a wiring circuit board with bumps that makes complex operations such as plating pre-treatment unnecessary.

The present inventor has discovered that bumps with a uniform height and a surface roughness on the tip faces thereof of 0.2 to 20 μm can be formed by half etching a metal foil with a surface roughness of 0.2 to 20 μm and a thickness that is the sum of the thickness corresponding to the height of the metal bumps and the thickness of the wiring circuit layer, to a depth corresponding to the desired thickness of the metal bumps, without performing complex operations such as plating pre-treatment, and thus stable bump connections can be realized. The present inventor has finally achieved the present invention.

Specifically, the present invention provides a wiring circuit board having bumps in which a cover coat layer is formed on a first side of a wiring circuit, an insulating layer is formed on a second side of the wiring circuit, and bumps in continuity with the wiring circuit are formed such that they project from said insulating layer, wherein the wiring circuit and bumps are integrally formed from one metal foil, and a surface roughness of the tip faces of the bumps is 0.2 to 20 μm.

In this wiring circuit board having bumps, it is preferred that a metallic thin film layer consisting of a metal different from the metal foil is provided between a bump formation surface on the wiring circuit and the insulating layer, in order to improve the adhesive strength between the insulating layer and the metal foil. In particular, in the event that the insulating layer is a polyimide layer imidized from a polyimide precursor layer, it is preferred that the metallic thin film layer exhibits an adhesive strength to the polyimide precursor layer that is higher than the metal foil. In this way, the adhesiveness with the polyimide precursor layer (and the imidized layer) can be improved. A combination of copper foil for the metal foil, and a thin film of Ni, Zn, Sn or Ni—Co alloy and the like for the metallic thin film layer can be preferably mentioned as a combination for this type of metal foil and metallic thin film layer.

In addition, it is preferred that the cover coat layer has a connection aperture that allows access to the wiring circuit from the cover coat side.

In addition, the present invention provides a method of manufacturing a wiring circuit board having bumps in which the bumps formed on the wiring circuit have a surface roughness on the tip fares thereof of 0.2 to 20 μm, the manufacturing method comprising the steps of:

(a) laminating a protective film on a bump formation surface of a metal foil having a surface roughness of 0.2 to 20 μm and a thickness which is the sum of a thickness of the wiring circuit and a height of the bumps to be formed on the wiring circuit, and forming an etching mask for wiring circuit formation on a wiring circuit formation surface of the metal foil;

(b) half etching the metal foil from the side of the etching mask for wiring circuit formation to form a wiring circuit with a desired thickness;

(c) providing a cover coat layer on the wiring circuit after removing the etching mask for wiring circuit formation;

(d) forming an etching mask for bump formation on the bump formation surface after removing the protective film provided on the bump formation surface of the metal foil;

(e) half etching the metal foil from the side of the etching mask for bump formation to form bumps of the desired height;

(f) forming a polyimide precursor layer to cover the bumps after removing the etching mask for bump formation; and (g) etching back the polyimide precursor layer and imidizing the same to form an insulating layer with a desired thickness. In this method of manufacturing, the wiring circuit is formed before bump formation.

In step (f) of this method of manufacturing, it is preferred that a metallic thin film consisting of a metal different from the metal foil (in particular, a metal having an adhesiveness to the polyimide precursor layer that is higher than the metal foil) is formed after the etching mask for bump formation is removed, and a polyimide precursor layer to cover the bumps is formed on the metallic thin film layer. In this way, the adhesiveness with the polyimide precursor layer (and the imidized layer) can be improved.

The present invention also provides a method of manufacturing a wiring circuit board having bumps in which the bumps formed on the wiring circuit have a surface roughness on the tip face thereof of 0.2 to 20 μm, the manufacturing method comprising the steps of:

(aa) laminating a protective film on the wiring circuit formation surface of the metal foil which has a surface roughness of 0.2 to 20 μm and having a thickness which is the sum of a thickness of the wiring circuit and a height of the bumps to be formed on the wiring circuit, and forming an etching mask for bump formation on a bump formation surface of the metal foil;

(bb) half etching the metal foil from the side of the etching mask for bump formation to form bumps of the desired height;

(cc) forming a polyimide precursor layer to cover the bumps after removing the etching mask for bump formation:

(dd) half etching the polyimide precursor layer and imidizing the same to form an insulating layer with a desired thickness;

(ee) forming an etching mask for wiring circuit formation on a wiring circuit formation surface after removing the protective film provided on the wiring circuit formation surface of the metal foil;

(ff) half etching the metal foil from the side of the etching mask for wiring circuit formation to form a wiring circuit with the desired thickness: and (gg) providing a cover coat layer on the wiring circuit after removing the etching mask for wiring circuit formation. In this method or manufacturing, the bumps are formed before the wiring circuit.

In step (cc) of this method of manufacturing, it is preferred that a metallic thin film consisting of a metal different from the metal foil (in particular, a metal having an adhesiveness to the polyimide precursor layer that is higher than the metal foil) is formed after the etching mask for bump formation is removed, and a polyimide precursor layer which covers the bumps is formed on the metallic thin film layer. In this way, the adhesiveness with the polyimide precursor layer (and the imidized layer) can be improved.

In addition, the present invention provides a method of forming bumps which are formed integrally with a wiring circuit in one metal foil, wherein the bumps has a surface roughness on the tip faces thereof of 0.2 to 20 μm, comprising the steps of:

forming an etching mask for bump formation on a bump formation surface of a metal foil which has a surface roughness of 0.2 to 20 μm and has a thickness which is the sum of a thickness of the wiring circuit and a height of the bumps to be formed on the wiring circuit: and half etching the metal foil from the side of the etching mask for bump formation to a depth which corresponds to the desired height for the bumps.

DESCRIPTION OF THE PREFERRED EMBODIMENTS

Each step in the process of manufacturing a wiring circuit board having bumps according to the present invention will be described in detail while referring to the Figures.

First, each step in the process of manufacturing a wiring circuit board having bumps in which the bumps are formed on the wiring circuit, and the process of manufacturing the wiring circuit before bump formation, will be described while referring to FIGS. 1A to 1G (steps (a) to (g)).

Step (a)

Figure 1A:
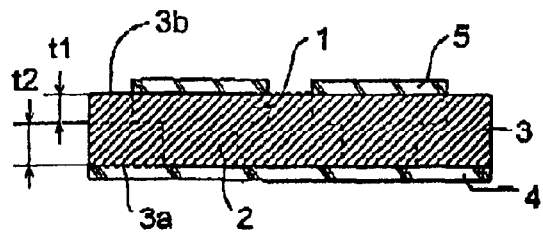
FIGS. 1A to 1G are diagrams of the steps of a method of manufacturing a wiring circuit board having bumps of the present invention.

First, a protective film 4 is laminated onto a bump formation surface 3a of a metal foil 3, the metal foil 3 having a thickness that is the sum of a thickness t1 of a wiring circuit 1 (referred to with dotted lines in the FIG. 1A) and a height t2 of bumps 2 (referred to with dotted lines in the FIG. 1A) to be formed on wiring circuit 1. An etching mask for wiring circuit formation 5 is formed on a wiring circuit formation surface 3b of metal foil 3 (FIG. 1A).

Here, metal foil 3 employs a bump formation surface 3a that has a surface roughness of 0.2 to 20 μM, preferably 2 to 18 μm. By employing a metal foil 3 with this type of surface roughness, the surface roughness of the tip faces of bumps 2 can be made to be 0.2 to 20 μm, and preferably 2 to 18 μm. With bumps 2 having this type of surface roughness, because there are a large number of minute concave and convex portions formed on the tip faces (connecting surfaces), when an adhesive is used and another electronic component (connected member) is connected thereto, adhesive can be eliminated from the convex portions (protuberances). In addition, a highly reliable connection is made possible because a plurality of convex portions are in contact with the connected member.

Measurement of surface roughness can be done by using a commercially available surface roughness meter.

The optimal values for the thickness t1 of wiring circuit 1 and the height t2 of bumps 2 are selected in accordance with the purpose for which the wiring circuit board is to be used. For example, when the wiring circuit board will be used as a mount for a semiconductor device, the thickness t1 of wiring circuit 1 can be set to 20 μm, the height t2 of bumps 2 can be set to 30 μm, and the diameter of bumps 2 can be set to 50 μm.

In addition, the material used for the conducting layer in the wiring circuit board can be used as the material for metal foil 3, and copper foil can be preferably mentioned.

Etching mask 5 for wiring circuit formation can be formed on the wiring circuit formation surface 3b of metal foil 3 by screen printing a resist ink thereon. Alternatively, etching mask 5 for wiring circuit formation can also be formed by providing a photosensitive resin layer, a dry film or the like, and patterning by exposing and developing according to conventional methods.

Step (b)

Figure 1B:
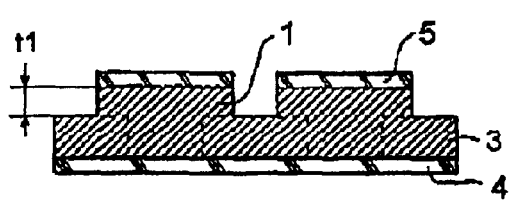

Next, the metal foil 3 from the etching mask 5 for wiring circuit formation side is half etched to form the desired thickness t1 of wiring circuit 1 (FIG. 1B).

The half etching conditions (temperature, etching fluid composition, and the like) can be appropriately selected in accordance with the composition of metal foil 3, the thickness of the etching to be performed, and the like.

Step (c)

Figure 1C:
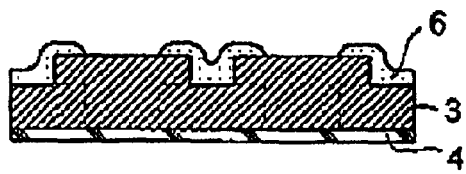

Next, after removing etching mask for wiring circuit formation 5 according to conventional methods, a cover coat layer 6 is provided on wiring circuit 1 (FIG. 1C).

Cover coat layer 6 can be formed by screen printing a coating material used for a cover coat layer. Alternatively, it can also be formed by providing a photosensitive resin layer, a dry film ox the like, and patterning by exposing and developing according to conventional methods. In addition, it can also be formed by providing A layer formed of a polyimide precursor such as polyamic acid or the like, and patterning and imidization.

Step (d)

Figure 1D:
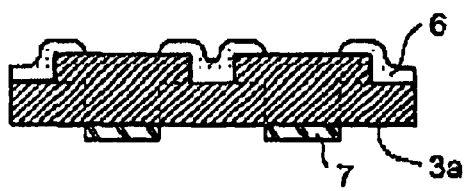

After removing protective film 4 provided on bump formation surface 3a of metal foil 3 according to conventional methods, an etching mask for bump formation 7 is formed on bump formation surface 3a (FIG. 1D)

Etching mask for bump formation 7 can be formed by screen printing a resist ink on bump formation surface 3a of metal foil 3. Alternatively, etching mask for bump formation 7 can also be formed by providing a photosensitive resin layer, a dry film or the like, and patterning by exposing and developing according to conventional methods.

Step (e)

Figure 1E:
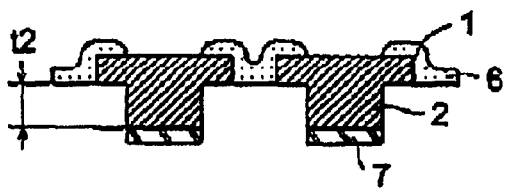

Next, the metal foil 3 from the etching mask for bump formation 7 side is half etched to form the desired height t2 of bumps 2 (FIG. 1E). The degree of surface roughness of the tip faces of bumps 2 formed thereby corresponds to the surface roughness of metal foil 3, and is thus 0.2 to 20 μm.

The half etching conditions (temperature, etching fluid composition, and the like) can be appropriately selected in accordance with the composition of metal foil 3, the thickness of the etching to be performed, and the like.

Furthermore, cover coat layer 6 may be covered with a protective film before half etching takes place (not shown in the Figure).

Figure 1F:
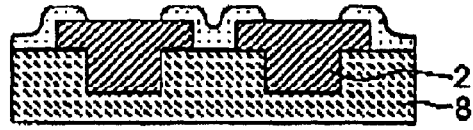

After removing etching mask for bump formation 7 according to conventional methods, a polyimide precursor layer 8 is formed in order to cover bumps 2 (FIG. 1F).

In the event that a protective film covers cover coat layer 6, the protective film may also be removed at the same time etching mask for bump formation 7 is removed.

In addition, polyimide precursor layer 8 can be formed by depositing polyamic acid or the like according to conventional methods. The imidization conditions also can be determined in accordance with the type of polyimide precursor and the like used.

Furthermore, in Step (f), after the etching mask for bump formation is removed, a metallic thin film layer consisting of a metal different from that of the metal foil is formed in order to improve the adhesive strength between the metal foil and the insulating layer. It is preferred that the polyimide precursor layer used to cover the bumps be formed on top of the metallic thin film layer. In this way, the adherence of the polyimide precursor layer (and the imidized polyimide layer) can be improved.

For the metallic thin film layer, it is preferred that it be formed from a metal exhibiting an adhesive strength to the latex mentioned polyimide precursor layer 8 that is higher than metal foil 3. In this way, the adhesiveness between polyimide precursor layer 8 and metal foil 3 can be enhanced, and thus, when undergoing chemical treatment (for example, the etch back treatment of polyimide precursor layer 8 in Step (g) and the like), the occurrence of peeling phenomena between metal foil 3 and polyimide precursor layer 8 or imidized insulating layer 9 can be prevented.

A thin film of Ni, Zn, Sn, or a Ni—Co alloy is preferably mentioned for this type of metallic thin film in the event that metal foil 3 is a conventional copper foil. These thin films can be formed by the electroless plating method, the electrolytic plating method, the vacuum evaporation method, and the like.

If the metallic thin film layer is too thin, the adhesiveness between insulating layer 9 and wiring circuit 1 cannot be sufficiently improved, and if it is too thick, no effect corresponding to the added thickness can be obtained. Thus, the thickness of the metallic thin film layer is preferably 0.01 to 4 μm. In particular, when the metallic thin film layer is a thin film of Zn or Sn, it is preferably 0.1 to 0.5 μm in thickness, when it is a thin film of a Ni—Co alloy, it is preferably 0.1 to 4 μm in thickness, and when it is a thin film of Ni, it is preferably 0.01 to 0.5 μm in thickness.

Step (g)

Figure 1G:
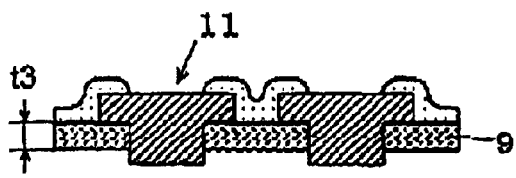

Polyimide precursor layer 8 is etch backed and imidized to form an insulating layer 9 with a desired thickness t3, whereby a wiring circuit board having bumps as shown in FIG. 1G is obtained.

Next, each step in the process of manufacturing a wiring circuit board having bumps in which the bumps are formed on top of the wiring circuit, and the process of manufacturing the bumps before wiring circuit formation, will be described while referring to FIGS. 2A to 2G (Steps (aa) to (gg)). Furthermore, the reference numerals used in FIGS. 2A to 2G that are the same as those used in FIGS. 2A to 2G refer to the same elements as in FIGS. 1A to 1G.

Step (aa)

First, a protective film 4 is laminated onto a wiring circuit formation surface 3b of a metal foil 3, the metal foil 3 having a thickness that is the sum of a thickness t1 of a wiring circuit 1 (referred to with dotted lines in the Figure) and a height t2 of bumps 2 (referred to with dotted lines in the Figure) to be formed on wiring circuit 1. An etching mask for bump formation 7 is formed on a bump formation surface 3a of metal foil 3 (FIG. 2A).

Here, metal foil 3 employs a bump formation surface 3a that has a surface roughness of 0.2 to 20 μm, preferably 2 to 18 μm.

Step (bb)

Figure 2:
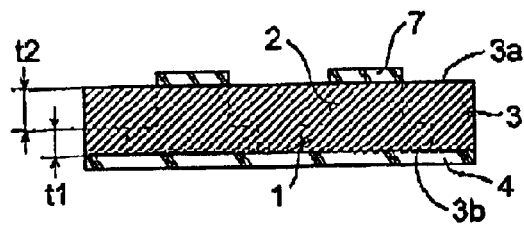
FIGS. 2A to 2C are diagrams of the steps of a method of manufacturing a wiring circuit board having bumps of the present invention.
Figure 2:
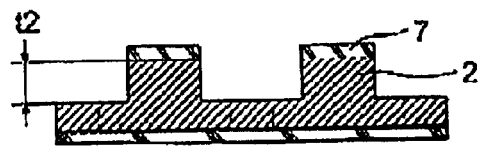
Figure 2:
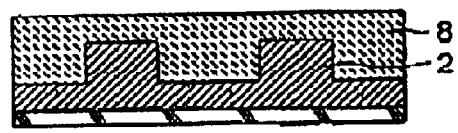
Figure 2:
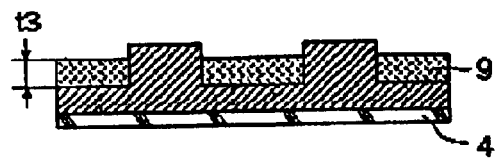
Figure 2:
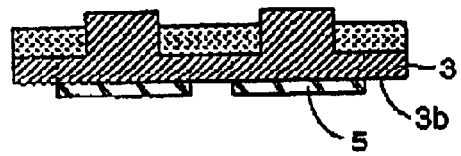
Figure 2:
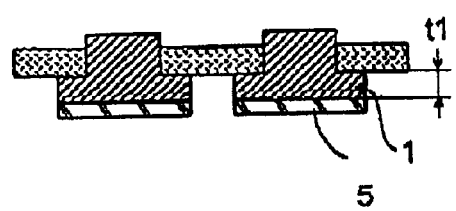
Figure 2:
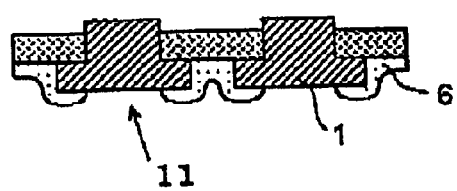

Next, the metal foil 3 from the etching mask for bump formation 7 side is half etched to form the desired thickness t2 of bumps 2 (FIG. 2B). The degree of surface roughness of the tip faces of bumps 2 formed thereby correspond to the surface roughness of metal foil 3, and thus is 0.2 to 20 μm.

Step (cc)

After removing etching mask for bump formation 7 according to conventional methods, a polyimide precursor layer 8 is formed which covers bumps 2 (FIG. 2C).

Furthermore, in Step (cc), after removing the etching mask for bump formation, it is preferred that a metallic thin film layer consisting of a metal different from the metal foil be formed, and a polyimide precursor layer for covering the bumps be formed on the metallic thin film layer (as referring to Step (f)).

Step (dd)

Polyimide precursor layer 8 is etch backed and imidized to form an insulating layer 9 with a desired thickness t3 (FIG. 2D)

Step (ee)

After removing protective film 4 provided on wiring circuit formation surface 3b of metal foil 3 according to conventional methods, an etching mask for wiring circuit formation 5 is formed on wiring circuit formation surface 3b (FIG. 2E).

Step (ff)

Next, the metal foil 3 from etching mask for wiring circuit formation 5 side is half etched to form the desired thickness t1 of wiring circuit 1 (FIG. 2F).

Furthermore, a protective film may be used to cover bumps 2 before half etching occurs.

Step (gg)

After etching mask for wiring circuit formation 5 is removed according to conventional methods, a cover coat layer 6 is provided on wiring circuit 1. In this way, the wiring circuit board having bumps shown in FIG. 2G can be obtained.

Furthermore, in the event that a protective film covers bumps 2, the protective film may also be removed at the same time etching mask for wiring circuit formation 5 is removed.

As shown in FIG. 1G and FIG. 2G, the wiring circuit board having bumps obtained by the aforementioned manufacturing method of the present invention has cover coat layer 6 formed on one side of wiring circuit 1, insulating layer 9 formed on the other side thereof, and bumps 2 in continuity with wiring circuit 1 formed such that they project out from insulating layer 9. However, the height of a plurality of bumps can be made uniform because wiring circuit 1 and bumps 2 are formed integrally from one metal foil. In addition, a constant bump connection is possible because a large number of protrusions are formed on the tip faces of bumps 2, and complex operations such as plating pre-treatment become unnecessary. Furthermore, because cover coat layer 6 has connector ports 11 for allowing access to wiring circuit 1 from the cover coat layer side, the wiring circuit board having bumps becomes a double sided access board, and can contribute to an increase in the packaging density of electronic devices.

Figure 3:
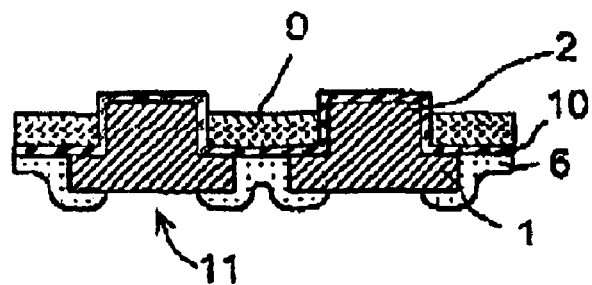
FIG. 3 is a cross-section of an example of a wiring circuit board having bumps of the present invention.

In addition, as shown in FIG. 3, when a metallic thin film 10 consisting of a metal different from the metal toil is provided between the bump formation surface of wiring circuit 1 and insulating substrate 9, it is possible to improve the adhesiveness of insulating layer 9. In particular, when insulating layer 9 is a polyimide layer imidized from a polyimide precursor layer, it is preferred that metallic thin film layer 10 is formed from a material exhibiting an adhesive strength to the polyimide precursor layer that is higher than the metal foil. For example, when the metal foil is a copper foil, the thin film is formed from Ni, Zn, Sn, or a Ni—Co alloy and the like. By constructing the metallic thin film layer in this manner, the adhesiveness between the polyimide precursor layer and the metal foil can be enhanced, and thus, when undergoing chemical treatment (for example, the etch back treatment of the polyimide precursor layer and the like), the occurrence of peeling phenomena between the metal foil and polyimide precursor layer or the imidized insulating layer 9 can be prevented.

Figure 4:
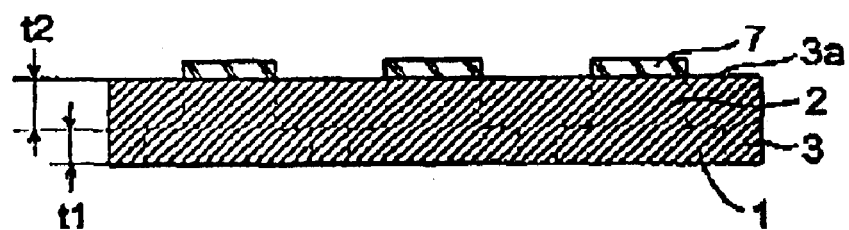
FIGS. 4A and 4B are diagrams of the steps of a bump formation method.
Figure 4:
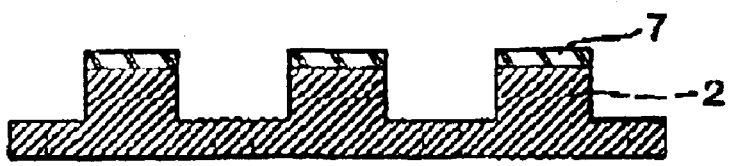
Figure 5:
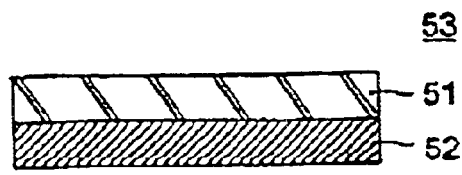
FIGS. 5A to 5E are diagrams of the steps of a conventional method of manufacturing a wiring circuit board having bumps.
Figure 5:
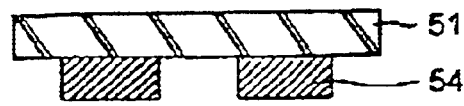
Figure 5:
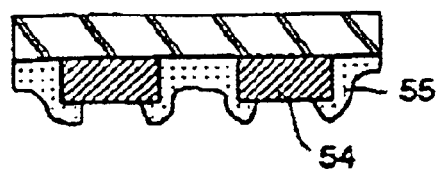
Figure 5:
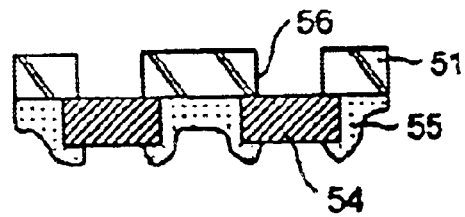
Figure 5:
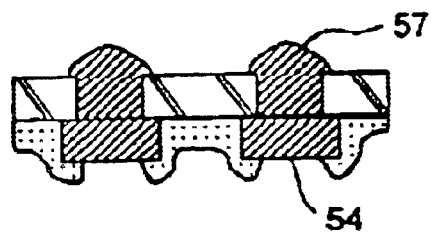

Furthermore, the bump formation method described in FIGS. 4A and 4B can be derived from the manufacturing method for the wiring circuit board having bumps described in FIGS. 1A to 1G and FIGS. 2A to 2G when the bump formation method aspect thereof is clearly understood.

Specifically, as shown in FIG. 4B, bumps 2 having a tip face roughness of 0.2 to 20 $\mu$m can be formed by forming an etching mask for bump formation 7 on bump formation surface 3a of metal foil 3 having a thickness (t1+t2) which is the sum of thickness t1 of wiring circuit 1 and height t2 of bumps 2 to be formed on wiring circuit 1, in which the surface roughness of the bump formation surface is 0.2 to 20 $\mu$m (FIG. 4A), and half etching metal toil 3 from the etching mask for bump formation 7 side to a depth corresponding to the desired bump height t2. In this case, the process for forming wiring circuit 1 may occur after the formation of bumps 2, and the formation of bumps 2 may occur after the process for forming wiring circuit 1 has previously occurred.

In this way, the height of the bumps obtained thereby are uniform, and the combined thickness of the wiring circuit and bumps are constant. Thus, a stable bump connection is made possible.

According to the manufacturing method of the present invention, a wiring circuit board having bumps can be provided in which bump strength is stable, stable bump connections are possible, and complex operations such as plating pre-treatment are unnecessary. In particular, bump connections on integrated circuits can be stably connected in one batch by means of ultrasound.

The entire disclosure of the specification, summary, the claims and drawings of Japanese Patent Application No. 2000-303745 filed on Oct. 3, 2000 is hereby incorporated by reference.

What is claimed is:

1. A wiring circuit board having bumps in which a cover coat layer is formed on a first side of a wiring circuit, an insulating layer is formed on a second side of the wiring circuit, and bumps in continuity with the wiring circuit are formed such that they project from said insulating layer, wherein the wiring circuit and bumps are integrally formed from one metal foil, and a surface roughness of the tip faces of the bumps is 0.2 to 20 $\mu$m;

the cover coat layer has a connection aperture which allows access to the wiring circuit from the cover coat side; and peripheries of the wiring circuit at the connection aperture are covered with the cover coat layer.

2. The wiring circuit board having bumps according to claim 1, wherein a metallic thin film layer consisting of a metal different from the metal foil is provided between a bump formation surface of the wiring circuit and the insulating layer.

3. The wiring circuit board having bumps according to claim 2, wherein the insulating layer is a polyimide layer imidized from a polyimide precursor layer, and the metallic thin film layer exhibits an adhesive strength to the polyimide precursor layer that is higher than the metal foil.

* * * * *